United States Patent [19]

Straw

[11] 3,959,746
[45] May 25, 1976

[54] AUTOMATIC ANTENNA COUPLER TUNING CONTROL CIRCUIT

[75] Inventor: Richard D. Straw, San Francisco, Calif.

[73] Assignee: International Telephone and Telegraph Corporation, Nutley, N.J.

[22] Filed: Nov. 18, 1974

[21] Appl. No.: 524,436

Related U.S. Application Data

[63] Continuation-in-part of Ser. No. 407,325, Oct. 17, 1973, abandoned.

[52] U.S. Cl. .............................. 333/17 M; 325/172; 325/177; 333/32; 334/47
[51] Int. Cl.² ..................... H03H 7/40; H03H 7/10; H03J 5/00
[58] Field of Search ................. 333/17 R, 17 M, 32; 334/47; 325/22–25, 171–177; 307/215, 231–233, 235 R, 235 A, 239, 241, 247 R

[56] References Cited
UNITED STATES PATENTS

| | | | |
|---|---|---|---|
| 3,390,337 | 6/1968 | Beitman, Jr. | 333/17 |
| 3,509,500 | 4/1970 | McNair et al. | 333/17 X |
| 3,794,941 | 2/1974 | Templin | 333/17 |

*Primary Examiner*—Alfred E. Smith
*Assistant Examiner*—Marvin Nussbaum
*Attorney, Agent, or Firm*—John T. O'Halloran; Menotti J. Lombardi, Jr.; Alfred C. Hill

[57] ABSTRACT

A control circuit is disclosed to automatically tune an antenna coupler to provide an output signal having a selected one of different operating frequencies. The antenna coupler includes a frequency band selecting switch and a plurality of tuning elements certain or which are available to provide the desired output signal. The switch is controlled by a first relay controlled motor and the variable tuning elements are controlled by a second relay controlled motor. First logic circuitry is coupled to the first and second motors to control the tuning of the antenna coupler sequentially through a preposition step, a tuning step and an antenna coupler ready step. An amplitude comparator having a given capture range has its input coupled to the antenna coupler and second logic circuitry is coupled to the amplitude comparator, the first logic circuitry and the second motor. The second means is responsive to a first output signal of the amplitude comparator which is produced when the output of the antenna coupler is in the given capture range to control the second motor to tune the variable tuning elements during the tuning step and the second means is also responsive to a second output signal of the amplitude comparator produced when the output signal of the antenna coupler is outside the given capture range to control the second motor to tune the variable tuning elements during the tuning step until the output signal of the antenna coupler is within the given capture range and thereby will enable the first output signal of the amplitude comparator to control the tuning of the tuning elements during the tuning step.

12 Claims, 3 Drawing Figures

3,959,746

AUTOMATIC ANTENNA COUPLER TUNING CONTROL CIRCUIT

CROSS-REFERENCE TO RELATED APPLICATIONS

This is a continuation-in-part application of my co-pending application Ser. No. 407,325 filed Oct. 17, 1973, now abandoned.

BACKGROUND OF THE INVENTION

This invention relates to an automatic tuning circuit and more particularly to an automatic antenna coupler tuning circuit.

SUMMARY OF THE INVENTION

An object of the present invention is to provide an improved automatic antenna coupler tuning control circuit.

Another object of the present invention is to provide an improved automatic antenna coupler tuning control circuit capable of being manufactured employing integrated circuit techniques.

A feature of the present invention is the provision of a control circuit to automatically tune an antenna coupler to provide an output signal having a selected one of different operating frequencies comprising: the antenna coupler including a frequency band selecting switch and a plurality of tuning elements including a plurality of variable tuning elements to provide the output signal; a first relay controlled motor coupled to the switch; a second relay controlled motor coupled to the variable tuning elements; first means coupled to the first and second motors to control the tuning of the antenna coupler sequentially through a preposition step, a tuning step and an antenna coupler ready step; an amplitude comparator having a given capture range coupled to the antenna coupler; and second means coupled to the amplitude comparator, the first means and the second motor; the second means being responsive to a first output signal of the amplitude comparator produced when the output signal of the antenna coupler is in the given capture range to control the second motor to tune the variable tuning elements during the tuning step; and the second means being responsive to a second output signal of the antenna comparator produced when the output signal of the antenna coupler is outside the given capture range to control the second motor to tune the variable tuning elements during the tuning step until the output signal of the antenna coupler is within the given capture range and the first output signal of the amplitude comparator can then control the second motor through the second means to tune the variable tuning elements during the tuning step.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

Figure 1:
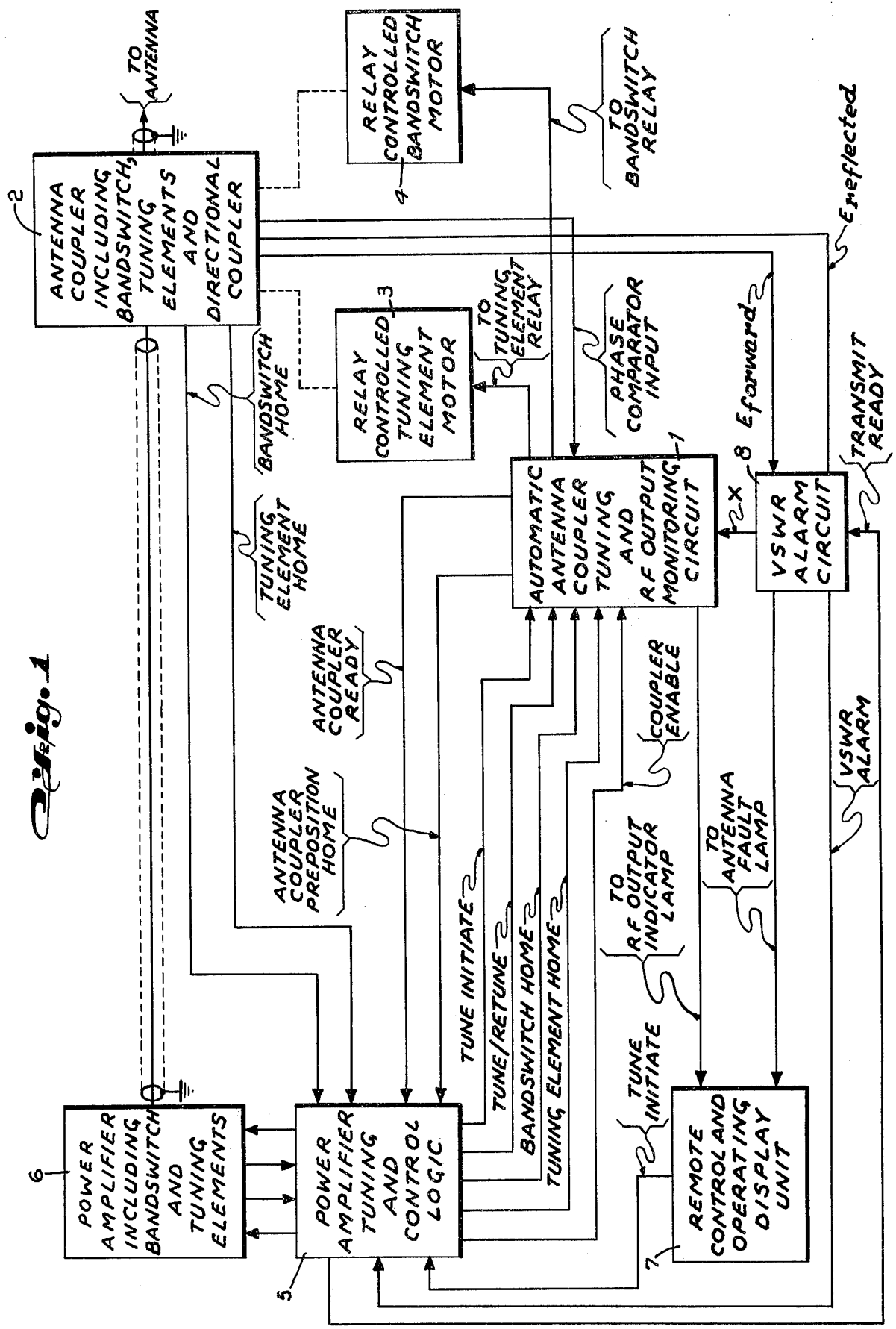
FIG. 1 is a block diagram illustrating the radio frequency (RF) portion of a transmitter of a transceiver incorporating the automatic antenna coupler tuning control circuit in accordance with the priciples of the present invention.

FIG. 1 illustrates how the automatic antenna coupler tuning control and RF output monitoring circuit 1 is interconnected with other cooperating circuits of the RF portion of the transmitter of a transceiver and also the flow of the various signals needed to actuate circuit 1 and the signals produced at the output thereof to control the other cooperating circuits. Circuit 1 operates on the antenna coupler 2 (FIG. 3) including a frequency range selecting bandswitch SWA-SWG coupled to frequency variable tuning elements capacitor C1 and inductor L1, non-variable tuning elements inductors L2–L24 certain ones of which are adjustable and fixed capacitors C2–C3. The variable tuning elements are mechanically controlled for adjusting the resonant frequency thereof by circuit 1 through relay controlled tuning element motor 3. The bandswitch is mechanically rotated to the selected frequency band and selects the appropriate non-variable tuning elements to be coupled to the variable tuning elements by the selected frequency band by relay controlled bandswitch motor 4. The power amplifier tuning and control logic 5 functions to tune power amplifier 6 to the same frequency as antenna coupler 2 and to generate tuning control command signals for circuit 1. The tuning portion of logic 5 is actuated by a tune initiate signal from the remote control and operating display unit 7 and the control portion of the logic 5 generates the tuning control command signals for circuit 1. The control portion of logic 5 also sends a transmit ready signal to the VSWR alarm circuit 8 which is fully disclosed in the copending application of R. D. Straw Ser. No. 406,711, filed Oct. 15, 1973, whose disclosure is incorporated herein by reference. Alarm circuit 8 provides an output to light an antenna fault lamp in unit 7 and a VSWR alarm which is processed in logic 5. The forward voltage and reflected voltage for operating alarm circuit 8 is derived from a directional coupler DC in antenna coupler 2. The forward voltage present in alarm circuit 8 is used to cooperate with the RF output monitoring circuit of circuit 1 as indicated by the conductor X. Circuit 1 provides logic 5 with an antenna coupler ready signal and an antenna coupler preposition home signal which are utilized in logic 5 together with a bandswitch home signal and a tuning element home signal from coupler 2 to generate various ones of the tuning control command signals for circuit 1.

Figure 2:
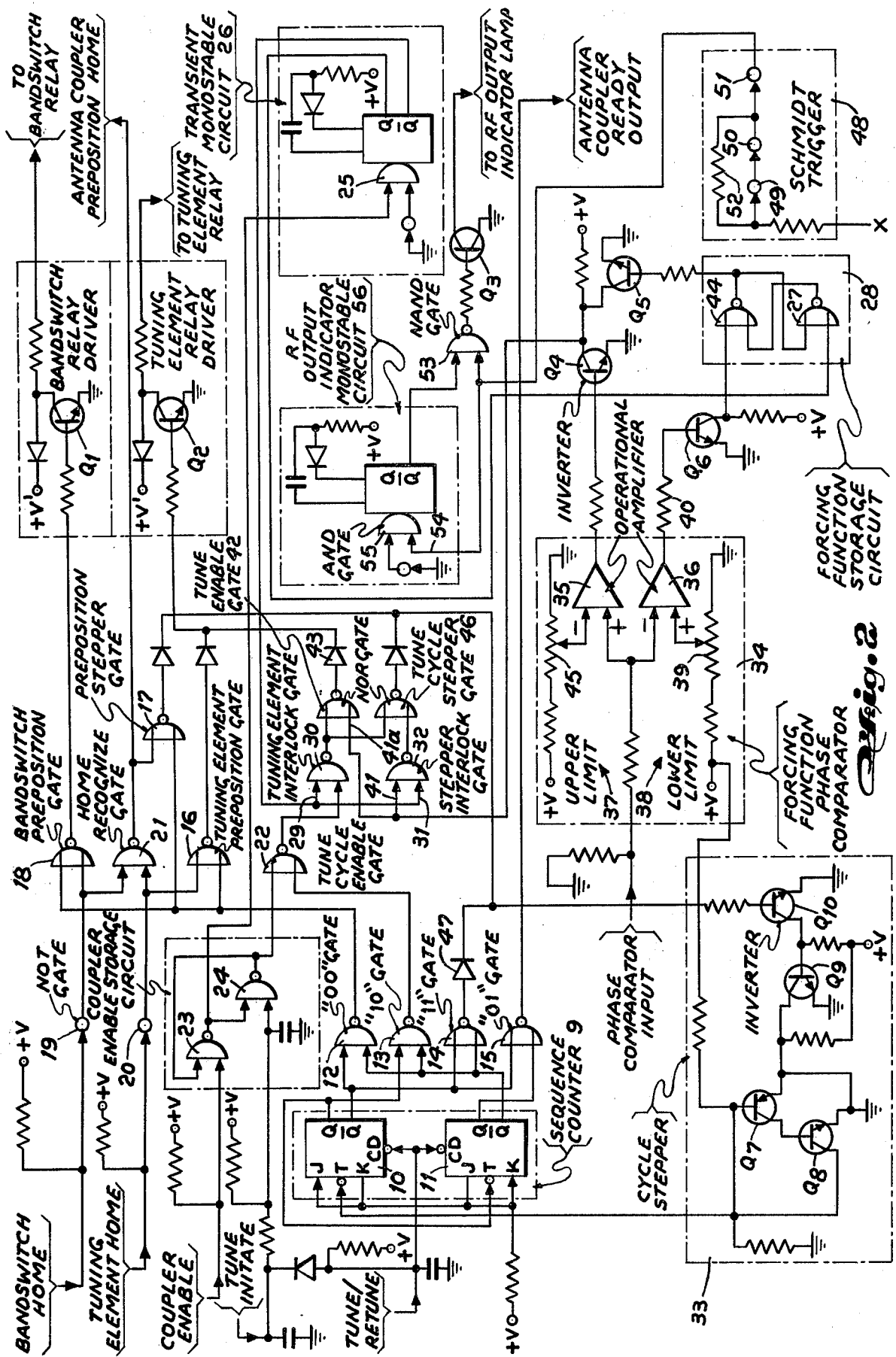
FIG. 2 is a logic diagram of the automatic antenna coupler tuning control circuit in accordance with the principles of the present invention.

Referring to FIG. 2 there is disclosed therein a logic circuitry of control circuit 1 of FIG. 1. It should be noted in FIG. 2 that at least one of all the logic symbols employed therein has been identified by a legend and all similar symbols have the identical logic function as the labeled symbol.

The circuit of FIG. 2 contains the necessary analog and logic elements to control the tuning of antenna coupler 2 and includes an RF output monitoring system.

Briefly, the automatic antenna coupler tuning control circuit of the present invention may be described as follows. The antenna coupler is tuned up in a sequential manner. There are four logic states involved in the automatic tuning process: (1) the "preposition" state, (2) the "tune" state, (3) the "coupler ready" state and (4) the "false" state.

In the preposition state the variable tuning elements C1 and L1 are tuned by motor 3 to their "home" position, and the bandswitch is moved by motor 4 to one of 12 band positions as dictated by logic 5 (FIG. 1). When the tuning element and bandswitch are "home" antenna coupler 2 (FIG. 1) relays this information to logic 5 and circuit 1 awaits a tune command from logic 5.

In the tune state the variable tuning elements C1 and L1 are adjusted until the amplitude comparator of circuit 1 indicates an amplitude error within the capture range set by resistors 39 and 45. The amplitude comparator of circuit 1 is coupled by a directional coupler DC to antenna coupler 2. This process occurs after a "coupler-enable" command is received from logic 5. The tuning control circuit can complete its tuning sequence only if sufficient RF energy is available from the power amplifier to first stop the "forcing function" logic. This forcing function logic turns the selected variable tuning elements by motor 3 away from the home position until the output signal of the coupler is within the capture range of the amplitude comparator and then the amplitude comparator takes control and tunes for an amplitude error within the capture range. After the amplitude comparator is satisfied, the logic circuitry of the tuning control circuit 1 advances to the coupler ready state.

In the coupler ready state the tuning circuit logic sends a coupler ready signal to logic 5 to allow logic 5 to go into a "load" sequence.

The fault state is an unused state that might occur due to power turnon transients. If this state is ever encountered the logic circuitry of the tuning control circuit 1 is automatically advanced to the preposition state.

Turning now to a more detailed description of FIG. 2, the heart of the tuning circuit is a sequence counter 9 which contains two JK flip flops 10 and 11. These flip flops 10 and 11 are wired as a two-bit ripple counter having four possible states. These four states are decoded by NAND gates 12–15.

A "tune initiate" command from the remote control unit 7 via logic 5 causes flip flops 10 and 11 to be reset to zero. This 00 state is the preposition state. The output of NAND gate 12 goes low and transmits this low to one input of NOR gate 16, one input of NOR gate 17 and one input of NOR gate 18.

If the bandswitch in coupler 2 has not found the band position dictated, a low command is received from logic 5 causing the second input of NOR gate 18 to go high via NOT gate 19 and, thus, the output of NOR gate 18 is high and transistor Q1, the bandswitch relay driver, is turned on. The bandswitch motor 4 (FIGS. 1 and 3) is thus enabled to move the bandswitch SWA-SWG to the dictated band position.

Similarly, if the tuning elements of coupler 2 are not in the home position, a low command is received from logic 5, then through NOT gate 20 and NOR gate 16, transistor Q2, the tuning element relay driver, is enabled and the tuning element motor 3 (FIGS. 1 and 3) is enabled to slew or tune the variable tuning elements to the home position.

When the tuning elements are at the home position and the bandswitch is on the correct band, the output of NAND gate 21 goes low which provides an indication to logic 5 (FIG. 1) that the coupler has successfully prepositioned by means of an antenna coupler preposition home signal. The output of NOR gate 22 goes high at this point enabling the cycle stepper 33. This cycle stepper consists of a PNP-NPN transistor pair Q7 and Q8 which act in a manner very similar to that of an unijunction transistor. A sharp negative going pulse of predetermined amplitude is delivered to the toggle input of flip flop 10 about 10 milliseconds after transistor Q10, the control transistor, is enabled. This pulse makes flip flops 10 and 11 assume a 10 state with the Q output of flip flop 10 being high and the Q output of flip flop 11 being high.

This 10 state is the tune state. Here the output of NAND gate 13 goes low. The coupler logic stays in a waiting state not doing anything until a "coupler enable" command signal is received from logic 5 (FIG. 1). NAND gates 23 and 24 are connected as a set/reset flip flop by cross connecting outputs and inputs as illustrated. The "tune initiate" signal that started the whole sequence sets this latter flip flop so that the output of gate 24 goes high. Receipt of a "coupler enable" command signal causes the output of gate 23 to go high. This positive going pulse triggers one input of AND gate 25 and causes the monostable circuit 26 to deliver a high output on its Q output of approximately 100 milliseconds. This monostable action is necessary to prevent transients in the amplitude comparator input line caused by RF switching transients in logic 5 (FIG. 1) from "fooling" the tuning circuit forcing function logic. This 100 millisecond long high output from the Q output of circuit 26 forces the output of NOR gate 27 of the forcing function storage circuit 28 to go low thereby setting the forcing function storage circuit 28. The Q output of circuit 26 provides a 100 millisecond long low output to disable input 29 of the tuning element interlock NAND gate 30 and also to disable input 31 of stepper interlock gate 32 so that the coupler tuning elements are constrained from being allowed to be turned during this period and so that the cycle stepper 33 cannot falsely fire.

Figure 3:
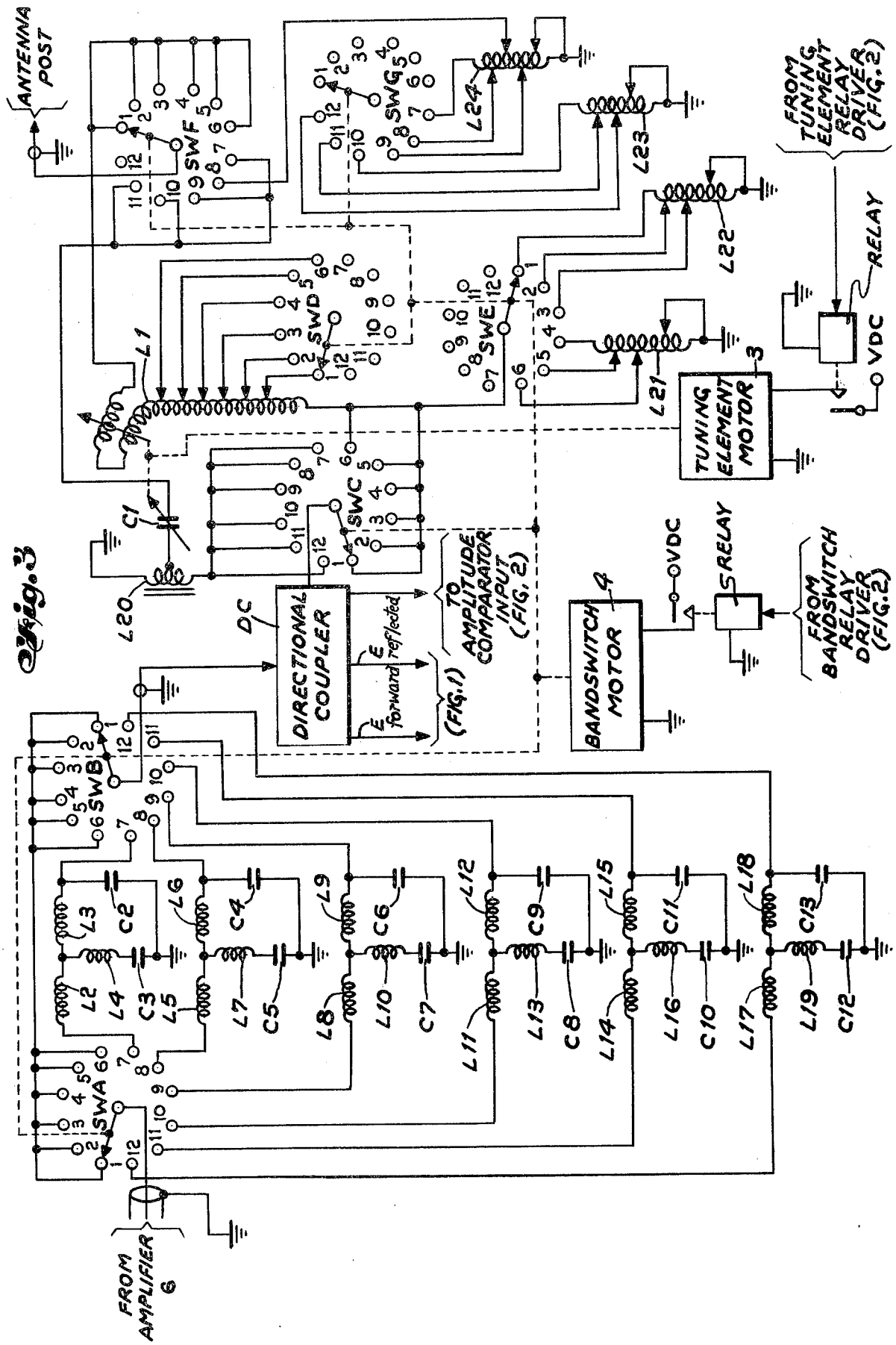
FIG. 3 is a schematic diagram partially in block form of the antenna coupler of FIG. 1.

At the end of the 100 millisecond monostable period, coupler 2 (FIG. 1) has RF being applied to it from power amplifier 6. If the preposition point of the tuned elements in coupler 2 is such that input signal to forcing function amplitude comparator 34 from directional coupler DC of coupler 2 is not within the capture range of comparator 34, then the output of comparator 34 will be a low voltage. It is to be noted that this low voltage should not be confused with a "logic low." The low here indicates an analog quantity. Comparator 34 includes operational amplifiers 35 and 36 with a voltage source 37 establishing an upper amplitude limit to the capture range as well as the zero amplitude reference level and voltage source 38 establishing a lower amplitude limit for the capture range. The inverting input of amplifier 36 is coupled to the amplitude comparator input from coupler 2 (FIG. 1) while the lower amplitude limit voltage source is coupled to the non-inverting input of amplifier 36. Thus, in the situation of comparator 34 not receiving a signal from coupler 2 in its capture range, the output of amplifier 36 will be high since the inverting input is lower than the non-inverting input whose value is set by resistor 39 to preselected value. In this situation transistor Q6 is turned on through resistor 40 and transistor Q5 is enabled. The collector of transistor Q5 is held low by transistor Q4 and the collector of transistor Q4 is held low by transistor Q5. Thus, input 41 of NAND gate 32 and input 41a of tune enable gate 42 are low. Since the Q output of circuit 26 has by this time reverted to a 1 state and since the output of gate 22 is high the output of gate 30 is low. Therefor, the output of gate 42, the tune enable gate, is high and through diode 43 transistor Q2 is turned on to actuate motor 3 (FIGS. 1 and 3).

When motor 3 has tuned the variable tuning elements in coupler 2 sufficiently to have the output signal of coupler 2 within the capture range of comparator 34 then the comparator output will be a positive voltage greater than the reference level on the non-inverting input of amplifier 36. The output of amplifier 36 will then go low and transistor Q6 will be turned off and the output of NOR gate 44 will go low. The storage circuit 28 will remain in this state and transistor Q5 will be out of the circuit henceforth. Comparator 34, however, will go high at the output of operational amplifier 35 whenever the input of the comparator 34 is greater than a predetermined upper amplitude limit voltage of the capture range as established by resistor 45. This will turn on transistor Q4 and keep the tuning element motor 3 (FIGS. 1 and 3) turning. After the input of comparator 34 goes lower than the upper amplitude limit reference level of amplifier 35 the output of amplifier 35 will go low turning off transistor Q4. Input 41 of gate 32 and input 41a of gate 42 will both go high and the output of both gates 32 and 42 will go low. By the output of gate 42 going low transistor Q2 is disabled and motor 3 is stopped. When the output of gate 32 goes low the output of tune cycle stepper gate 46 will go high and enable cycle stepper 33 to deliver a pulse to the toggle input of flip flop 10.

The sequence counter 9 will then advance to the 01 state with the Q output of flip flop 10 going high and the Q output of flip flop 11 going high. The output of gate 15 will go low delivering an "antenna coupler ready" signal to logic 5 (FIG. 1).

If the illegal state 11 is ever accidentally reached the output of gate 14 will go high which will enable cycle stepper 33 through diode 47 to pulse the sequence counter 9 back to the preposition 00 state.

The RF output indicator system associated with circuit 1 of FIG. 1 uses the forward voltage from the directional coupler DC (FIG. 3) of the VSWR alarm circuit 8 (FIG. 1) that is contained on conductor X. Circuit 8 of FIG. 1 is fully disclosed in the above-cited copending application. The forward voltage on conductor X triggers a Schmidt trigger 48 which includes three NOT gates 49, 50 and 51. Positive feedback occurs through resistor 52. When trigger 48 fires, the output of gate 51 goes low and the output of NAND gate 53 goes high. Transistor Q3 is thus enabled and through transistor Q3 the "RF output indicator" on the remote control unit 7 (FIG. 1) is lit. When trigger 48 is no longer fired the output of gate 51 goes high. This positive pulse triggers input 54 of AND gate 55 and the Q output of RF output indicator monostable circuit 56 goes low for about one second which again causes the output of NAND gate 53 to go high. The monostable circuit 56 is used to prevent the RF output lamp at the remote control unit from flickering during single sideband speech transmission.

While I have described above the principles of my invention in connection with specific apparatus it is to be clearly understood that this description is made only by way of example and not as a limitation to the scope of my invention as set forth in the objects thereof and in the accompanying claims.

I claim:

1. A control circuit to automatically tune an antenna coupler to provide an output signal having a selected one of different operating frequencies comprising:

said antenna coupler including a frequency band selecting switch and a plurality of tuning elements including a plurality of variable tuning elements coupled to said switch to provide said output signal;

a first relay controlled motor coupled to said switch;

a second relay controlled motor coupled to said variable tuning elements;

first means coupled to said first and second motors to control the tuning of said antenna coupler sequentially through a preposition step, a tuning step and an antenna coupler ready step;

an amplitude comparator having a given capture range coupled to said antenna coupler; and second means coupled to said amplitude comparator, said first means and said second motor;

said second means being responsive to a first output signal of said amplitude comparator produced when said output signal of said antenna coupler is in said given capture range to control said second motor to tune said variable tuning elements during said tuning step; and said second means being responsive to a second output signal of said amplitude comparator produced when said output signal of said antenna coupler is outside said given capture range to control said second motor to tune said variable tuning elements during said tuning step until said output signal of said antenna coupler is within said given capture range and said first output signal of said amplitude comparator can then control said second motor through said second means to tune said variable tuning elements during said tuning step.

2. A circuit according to claim 1, wherein said first means includes a sequence counter responsive to a first tuning control signal to initiate operation thereof to define said preposition step, said tuning step and said ready step, and first logic circuitry coupled to said sequence counter to produce in sequence a preposition step signal, a tuning step signal and a ready step signal.

3. A circuit according to claim 2, wherein said first means further includes second logic circuitry coupled to said first logic circuitry and said first and second motor, said second logic circuitry being responsive to said preposition step signal to control said first and second motor to preposition said switch and said variable tuning elements according to said selected one of different operating frequencies.

4. A circuit according to claim 3, wherein said second means includes third logic circuitry coupled to said first logic circuitry, said second motor and said amplitude comparator, said third logic circuitry being responsive to a coupler enable signal, said tuning step signal and said first output signal of said amplitude comparator to tune said variable tuning elements by said second motor under control of said first output signal of said amplitude comparator and responsive to said coupler enable signal, said tuning step signal and said second output signal of said amplitude comparator to tune said variable tuning elements by said second motor under control of said second output signal of said amplitude comparator.

5. A circuit according to claim 4, wherein said first means further includes
a counter stepper circuit coupled to said first logic circuitry, said second logic circuitry, said sequence counter and said third logic circuitry, said stepper circuit being responsive to a false state signal from said first logic circuitry to step said sequence counter to define said preposition step, responsive to an output signal of said third logic circuitry produced by an amplitude zero indication of said first output signal of said amplitude comparator to step said sequence counter to said ready step and responsive to an output signal of said second logic circuitry produced when said switch and said tuning elements are properly prepositioned to step said sequence counter to said tune step.

6. A circuit according to claim 2, wherein said sequence counter includes
two J-K flip flops interconnected as a two bit ripple counter having four possible states, 00 state defining said preposition step, a 10 state defining said tuning step, a 01 state defining said ready step and a 11 state defining a false state; and
said first logic circuitry includes
a first NAND gate coupled to said two flip flops to detect said 00 state to produce said preposition step signal,
a second NAND gate coupled to said two flip flops to detect said 10 state to produce said tuning step signal,
a third NAND gate coupled to said two flip flops to detect said 01 state to produce said ready step signal, and
a fourth NAND gate coupled to said two flip flops to detect said 11 state to produce a false step signal.

7. A circuit according to claim 6, wherein said first means further includes
second logic circuitry coupled to said first NAND gate and said first and second motor, said second logic circuitry being responsive to said preposition step signal to control said first and second motor to preposition said switch and said variable tuning element according to said selected one of different operating frequencies.

8. A circuit according to claim 7, wherein said second means includes
third logic circuitry coupled to said second NAND gate, said second motor and said amplitude comparator, said third logic circuitry being responsive to a coupler enable signal, said tuning step signal and said first output signal of said amplitude comparator to tune said variable tuning elements by said second motor under control of said first output signal of said phase comparator and responsive to said coupler enable signal, said tuning step signal and said second output signal of said amplitude comparator to tune said variable tuning elements by said second motor under control of said second output signal of said amplitude comparator.

9. A circuit according to claim 8, wherein said second means includes
a storage circuit coupled to the input of said third logic circuitry to store said coupler enable signal.

10. A circuit according to claim 9, wherein said first means further includes
a counter stepper circuit coupled to said fourth NAND gate, said second logic circuitry, said third logic circuitry and one of said J-K flip flops, said stepper circuit being responsive to a false state signal from said fourth NAND gate to step said sequence counter to said preposition state, responsive to an output signal of said third logic circuitry produced by an amplitude zero indication of said first output signal of said amplitude comparator to step said sequence counter to said ready state and responsive to an output signal of said second logic circuitry produced when said switch and said variable tuning elements are properly prepositioned to step said sequence counter to said tune state.

11. A circuit according to claim 10, wherein said amplitude comparator includes
a first source of voltage defining an upper amplitude limit to said given capture range,
a second source of voltage defining a lower amplitude limit to said given capture range,
a first operational amplifier having its inverting input coupled to said first source, its non-inverting input coupled to said antenna coupler and its output coupled to said third logic circuitry,
a second operational amplifier having an output, its inverting input coupled to said antenna coupler and its non-inverting input coupled to said second source, and
a storage circuit coupled between the output of said second operational amplifier and said third logic circuitry.

12. A circuit according to claim 1, wherein said amplitude comparator includes
a first source of voltage defining an upper amplitude limit to said given capture range,
a second source of voltage defining a lower amplitude limit to said given capture range,
a first operational amplifier having its inverting input coupled to said first source, its non-inverting input coupled to said antenna coupler and its output coupled to said second means,
a second operational amplifier having an output, its inverting input coupled to said antenna coupler and its non-inverting input coupled to said second source, and
a storage circuit coupled between the output of said second operational amplifier and said second means.

* * * * *